United States Patent [19]

Evans et al.

[11] 4,048,573

[45] Sept. 13, 1977

[54] AMPLIFIER IMPROVEMENTS FOR LIMITING CLIPPING

[75] Inventors: Ronald C. Evans; Sidney A. Corderman, both of Binghamton, N.Y.

[73] Assignee: McIntosh Laboratory, Incorporated, Binghamton, N.Y.

[21] Appl. No.: 732,824

[22] Filed: Oct. 15, 1976

[51] Int. Cl.$^2$ .............................................. H03G 3/30
[52] U.S. Cl. .................................... 330/2; 330/28; 330/29; 330/59; 330/136; 330/139; 330/144; 330/149
[58] Field of Search .................. 330/2, 29, 59, 28, 96, 330/136, 139, 144, 145, 149, 207 P

[56] References Cited
U.S. PATENT DOCUMENTS 3,699,468  10/1972  Harmgarot ..................... 330/136 X

*Primary Examiner*—James B. Mullins
*Attorney, Agent, or Firm*—Pollock, Vande Sande & Priddy

[57] ABSTRACT

A differential amplifier is connected to an amplifier for comparing an amplifier input signal with the signal fed back by the amplifier feedback circuit. The output of the differential amplifier is coupled to a full wave rectifier the output of which controls an attenuator connected between a source of electrical input signals and the amplifier. When the amplifier is operating in its linear range, the differential amplifier inputs are identical and it does not produce an output. Under this condition, the input signal is not attenuated. However, in the presence of amplifier clipping, the differential amplifier produces an output which, after full wave rectification, operates to increase the attenuation, and thus reduce the amplitude of the signal applied to the amplifier; clipping is limited.

10 Claims, 10 Drawing Figures

POWER GUARD "NORMAL"
POWER GUARD "OUT"

F = 1000 Hz

AMPLIFIER IMPROVEMENTS FOR LIMITING CLIPPING

FIELD OF THE INVENTION

The present invention relates to improvements in high fidelity amplifiers to minimize clipping.

BACKGROUND OF THE INVENTION

In the last 20 to 30 years, there has been a veritable explosion of high fidelity equipment intended for home use. During this period of time, available equipment became more and more sophisticated; for example, stereophonic equipment has almost wholly displaced monophonic equipment. Other advances have been made both in the signal chain as well as in associated devices for control and/or protection purposes.

As those skilled in the art are aware, the primary object of such equipment is to increase the signal level to the extent necessary to drive whatever transducers are included in the system, while at the same time, maintaining as linear a characteristic as is possible. Since signal source levels vary, and since desirable audio listening levels can also vary, the equipment includes, almost universally, volume controls to vary the power output. For many years it has been known that the amplifiers included in the equipment were subject to clipping as a result of setting the amplifier for a relatively high power output, providing the amplifier with a relatively high input signal, or a combination of these factors. Clipping, of course, introduces distortion and, to that extent, thus destroys the desired linearity.

Ozawa et al in U.S. Pat. No. 3,761,775, illustrate a protective circuit which includes a device to compare the amplifier input with a modified form of the amplifier output which is adapted to open circuit the amplifier output if substantial differences exist. Ozawa et al teach that this arrangement can be employed to remedy clipping. As a device for minimizing clipping, this arrangement has at least two disadvantages. In the first place, an attenuation circuit is required to attenuate the output signal by approximately the same factor as the amplification factor of the amplifier. Since most of the amplifiers that are in use today in high fidelity equipment are feedback amplifiers, the attenuation circuit merely duplicates circuitry already included in the amplifier. Although the attenuation circuit, as illustrated in Ozawa is merely a voltage divider, in actual practice, phase correction would also be necessary requiring the addition of at least a capacitor. A second more significant disadvantage to the Ozawa arrangement is that in the presence of clipping, the output signal is removed from the loudspeaker. This appears to be an example of "cutting off your nose to spite your face". Particularly, the presence of clipping would distort the output signal and could disturb a listener. Removing the output signal entirely does not appear to be a desirable solution. Instead, what is desired is an arrangement to minimize the effect of clipping while retaining the desired output signal.

Suzuki et al, in U.S. Pat. No. 3,891,933, teach an arrangement which eliminates the first disadvantage mentioned above with regard to Ozawa, but their arrangement is no better than Ozawa with regard to the second disadvantage above-mentioned.

SUMMARY OF THE INVENTION

The present invention provides a device for minimizing the effect of clipping of an amplifier which includes a negative feedback coupling circuit coupling the output signal of the amplifier back to an input of the amplifier which further includes a differential amplifier with a pair of inputs, one coupled to the input electrical signal and the other connected to the output of the negative feedback coupling circuit, the differential amplifier producing an output signal when the inputs are different, a full wave rectifier connected to the output of the differential amplifier and input attenuator means coupling a source of electrical input signals to the amplifier and controlled by the output of the full wave rectifier for reducing the amplitude of the input signal when the differential amplifier produces an output.

BRIEF DESCRIPTION OF THE DRAWINGS

A preferred embodiment of the present invention will now be described when taken in conjunction with the attached drawings in which like reference characters identify identical apparatus and in which.

DETAILED DESCRIPTION OF THE INVENTION

Figure 1:
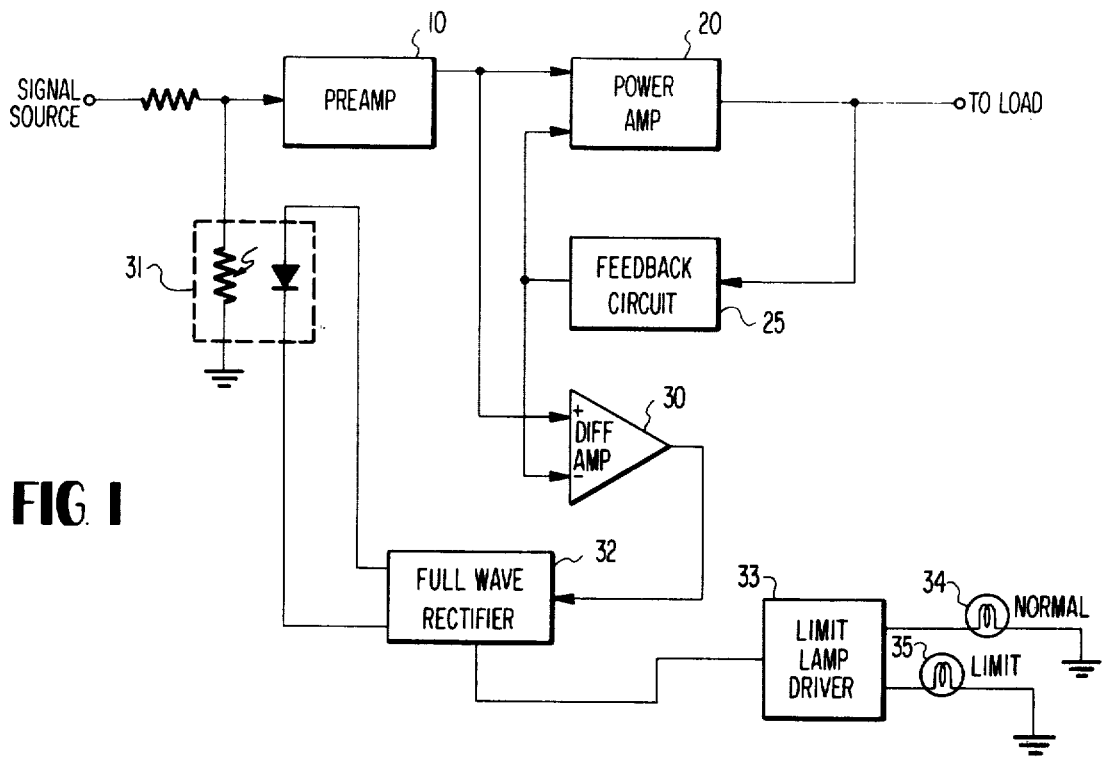
FIG. 1 is a block diagram of a preferred embodiment of the invention.

FIG. 1 illustrates a preferred embodiment of the present invention. More particularly, a signal source (not illustrated) provides a signal intended for amplification before application to a load (also not illustrated). The signal is provided as an input to a pre-amplifier 10. The output of the pre-amplifier 10 is provided to a power amplifier 20 which includes a feedback circuit 25 coupling the output of the power amplifier 20 to an input thereof. The inputs to the power amplifier including the output of the pre-amplifier 10 and the output of the feedback circuit 25, are coupled as inputs to a differential amplifier 30, whose output provides an input to a full wave rectifier 32. The output of full wave rectifier 32 drives an attenuator 31 as well as a limit lamp driver 33, whose output energizes either a normal indicator 34 or a limit indicator 35. As shown in FIG. 1, the input signal is connected to the input of pre-amplifier 10 through a resistance. Furthermore, the attenuator 31 is shown as being connected in parallel with the pre-amplifier 10 between the signal source and ground. As this description proceeds, those skilled in the art will understand that this pre-amplifier is not essential to the present invention and other forms of signal modifying means may be included in series with the pre-amplifier 10, or may be included between the pre-amplifier 10 and the power amplifier 20. Regardless of the specific connection and the specific type of device employed, the attenuator 31 performs the function of controlling the signal level supplied to the power amplifier 20 as a function of the output of full wave rectifier 32.

In normal operation, assuming that the input signal level and thus the power output of the amplifier 20 are such that clipping does not occur, the inputs to differential amplifier 30 will be substantially equal, and thus the differential amplifier 30 will produce substantially no output. There is no current to be rectified and therefore no output signal to the attenuator or limit lamp driver. As a result, the limit lamp driver energizes the normal indicator 34 and the attenuator 31 has no effect on the signal which is coupled through the pre-amplifier 10 to the power amplifier 20.

On the other hand, in the presence of clipping, which may be due to an excessive input signal level, excessive power output, or a combination of these two factors, the inputs to differential amplifier 30 will not be substantially equal. As a result, the differential amplifier 30 will produce a significant output which, after full wave rectification, has the following effects. The limit lamp driver 33 de-energizes the normal indicator 34 and energizes the limit indicator 35 to indicate that signal limiting is occurring. Furthermore, the attenuator 31 receives a significant output from the full wave rectifier 32 and reduces the input signal level to thereby minimize clipping.

As is known to those skilled in the art, clipping in an amplifier occurs as a result of an excursion of a signal to a control electrode of an amplifying device which exceeds the linear range of that device. Such an excessive excursion can be caused by excessive input signals to an amplifier or mismatched loads which exceed the linear output current capability of amplifier 20. The embodiment of the invention illustrated in FIG. 1 serves to minimize clipping by reducing the input signal level amplitude to the extent necessary to reduce the signal excursion at the amplifying device to the linear range.

Figure 2:
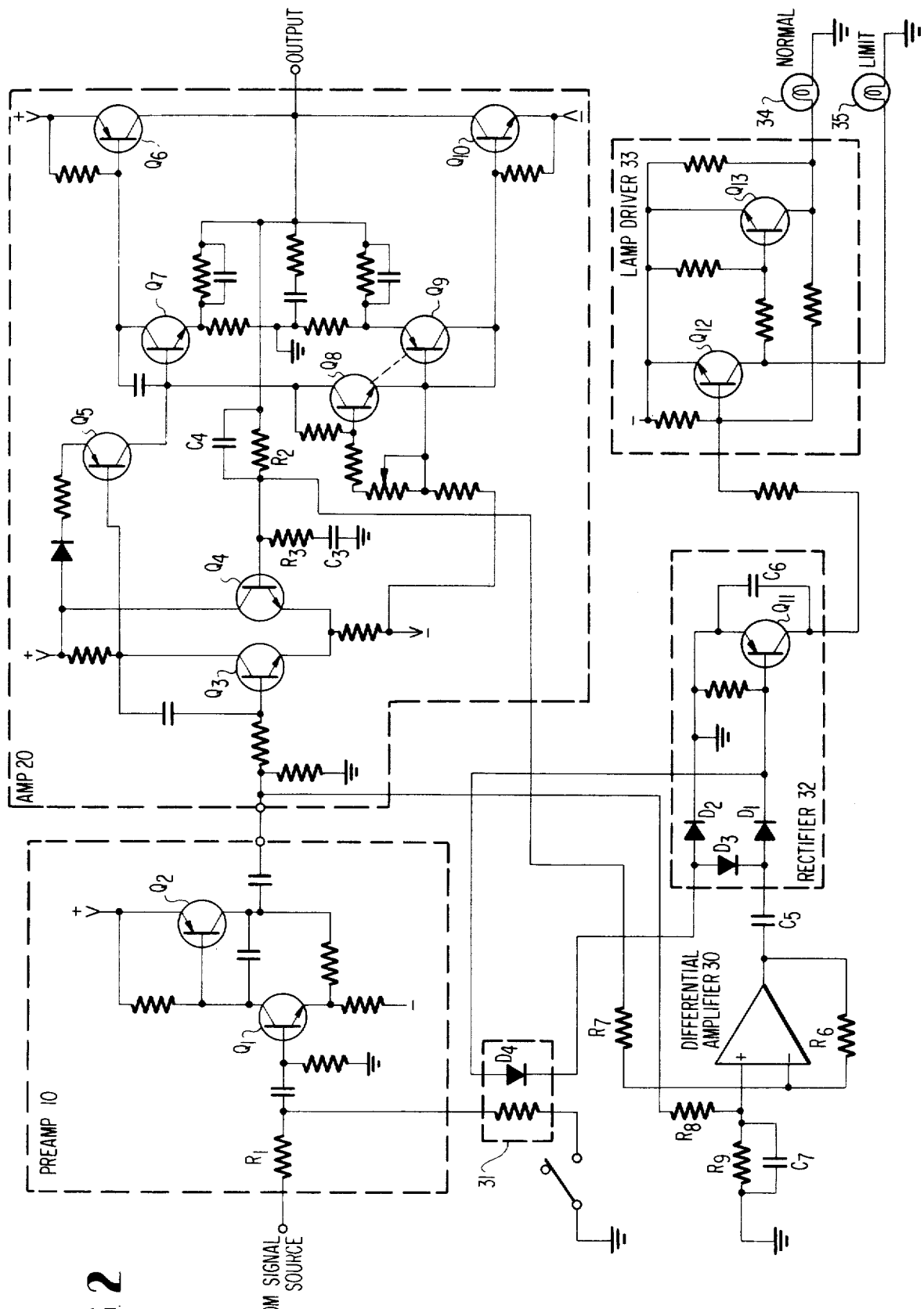
FIG. 2 is a schematic diagram of a preferred embodiment of the present invention; and, FIG. 3 is a plot of amplifier output as a function of time with and without the apparatus of the present invention.

Reference is now made to FIG. 2 for a more detailed understanding of the construction and operation of a preferred embodiment of the invention.

In FIG. 2, the signal source is connected through resistance R1 to a pre-amplifier 10 which includes a pair of transistors Q1 and Q2, and associated passive components coupling the signal from an unillustrated signal source to an input of amplifier 20. As has been mentioned above, the pre-amplifier 10 is not essential. One terminal of attenuator 31 is connected between the input to the pre-amplifier 10 and the base of transistor Q1. This terminal is connected to one terminal of a light dependent resistor (LDR) whose other terminal is connected to ground through a SPST switch. Attenuator 31 and R1 form a voltage divider which serves to reduce the input signal reaching pre-amplifier 10. The output of the pre-amplifier 10 is connected to the input of power amplifier 20 which includes a plurality of transistors Q3-Q10. Amplifier 20 is only illustrative of a variety of power amplifiers that can be employed, and, in fact, any power amplifier which includes feedback can be utilized. More particularly, the output of power amplifier 20 is taken at the junction of collectors of transistors Q6 and Q10. The junction of the collectors of Q6 and Q10 is connected to a resistor R2 and to a capacitor C4. The other terminal of the parallel combination of capacitor C4 and resistor R2 is connected to the base of transistor Q4. The base of Q4 is also connected to ground through a series circuit consisting of resistor R3 and capacitor C3. The aforementioned circuit comprises a feedback circuit included within a portion of the amplifier 20 in accordance with conventional feedback amplifier design so as to provide the amplifier with an overall linear amplification characteristic.

The inverting input of differential amplifier 30 is connected via resistor R7, to the base of transistor Q4; the non-inverting input of differential amplifier 30 is connected through resistor R8, to the input of amplifier 20.

The output of differential amplifier 30 is coupled, through capacitor C5, to a full wave bridge rectifier 32 comprising diodes D1-D3 and the base emitter junction of a transistor Q11. The cathode of diode D1 which is connected to the base of transistor Q11, is also connected to the anode of a light emitting diode (LED) D4 whose light output is optically coupled to the LDR in the attenuator unit 31. The cathode of the LED is coupled to the junction of the anodes of diodes D2 and D3. The collector of transistor Q11 is coupled to the emitter via a capacitor C6 and is also coupled via a resistor to the base of a transistor Q12, included in the lamp driver 33, which also includes transistor Q13. In lamp driver 33, the emitter of Q12 is connected to a negative supply which is also connected via a resistor to the base of transistor Q12. The base of transistor Q12 is also coupled via another resistor to the collector of transistor Q13 and to one terminal of an indicator light 34, whose other terminal is grounded. The emitter of Q13 is also coupled to a negative supply. The base of Q13 is connected via another resistor to the collector of Q12 and also, through a further resistor, to the same negative supply. The collector of Q12 is also connected to one terminal of another indicating light 35, whose other terminal is grounded. Finally, the collector of Q13 is connected, via a still further resistor to the negative supply.

In one embodiment of the invention, differential amplifier 30 uses a commercially available integrated circuit operational amplifier having the designation LM301A. In the same embodiment, the attenuator 31 uses a commercially available unit from Clairex, having the designation CLM6000.

The operation of the inventive circuit will now be explained assuming that the switch coupled to the attenuation device 31 is in its "on" condition, connecting one terminal of the LDR to ground. When the switch is in its "off" position, operation of the circuit has no effect on the signal passing the pre-amplifier 10 and amplifier 20 but does allow normal function of the indicator lights.

Under normal conditions, when the signal level to the amplifier is such that clipping does not occur, an input signal from the signal source passes through pre-amplifier 10, and is amplified in the amplifier 20 and made available at its output terminal. Amplifier 20 includes a feedback network including resistors R2-R3 and capacitors C3-C4. The output of this feedback network is provided to the base of transistor Q4, and is also provided as the inverting input to the differential amplifier 30. The differential amplifier also receives, on the non-inverting input, the same signal which is provided to the input of amplifier 20. Assuming that clipping is not occurring, these two signals will be substantially identical and the differential amplifier 30 will not produce an output. Under these conditions, there is no current to rectify and thus, the LDR in the attenuator 31 maintains its normally high resistance and the signal is passed to the preamplifier 10 unattenuated. At the same time, there is no drive from amplifier 30 to transistor Q11 and lack of conduction in transistor Q11 maintains transistor Q12 to cutoff and thus indicator 35 is not illuminated. At the same time, however, transistor Q13 is conducting. As a result, indicator 34 is illuminated by a current passing from ground through the indicator 34, through transistor Q13 to the negative supply. As indicated above, when the amplifier 20 operates in the linear range, the inputs to the differential amplifier 30 are substantially identical. Differential amplifier 30 is adjusted to have equal inverting and noninverting gains by proper selection of resistors R6 through R9. R6 and R7 determine the inverting gain. R8 and R9 adjust the gain of the non-inverting input to be equal in magnitude to that of the inverting input. Capacitor C7 across resistor R9 is used to adjust phase balance of the system at all operating frequencies. Optionally, the inverting and non-inverting differential amplifier inputs may be exchanged and equivalent system performance will be obtained.

If clipping now occurs, because the input signal level rises, the inputs to differential amplifier 30 will not be equal, the differential amplifier 30 will produce an output, which, when rectified by bridge rectifier 32 will produce a current flow through the LED in the attenuator 31, lowering the resistance of the LDR. The base-emitter junction of transistor Q11 is one diode of the bridge rectifier. Conduction of transistor Q11 will turn transistor Q12 on, and transistor Q13 off. This results in the indicator 35 activating and indicator 34 extinguishing.

Due to the forward breakdown voltage characteristic of the bridge rectifier diodes and LED D4, a finite signal is required from differential amplifier 30 before conduction starts. This characteristic in combination with the gain of differential amplifier 30 determines the clipping distortion level at which attenuator 31 and indicator lights 34 and 35 operate.

The reduced resistance of the LDR in attenuator 31 will reduce the signal amplitude applied to the base of transistor Q1 in the pre-amplifier 10 and thus have the effect of minimizing clipping. Since the current flowing in the LED is produced by reason of a difference between the inputs to differential amplifier 30 and the difference between these inputs is a function of the degree of clipping, the attenuator 31 will tend to reduce the input signal level to the extent necessary to minimize clipping. When the signal level from the signal source again decreases to the point where clipping would not ordinarily occur, the inputs to differential amplifier 30 will approach equality reducing the current flowing in the LED and thus allowing the resistance of the LDR to approach its nominal value, until the point where the circuit is again in its nominal condition.

In one embodiment, the attenuator 31 has a slow decay in attenuation to input current compared to a period of the signal to be amplified. Therefore, the attenuator 31 operates as an integrator of the output of differential amplifier 30. Thus, the complete wave form of the signal source is linearly attenuated.

Since clipping can occur on positive or negative peaks, the rectifier (full wave) is chosen so that it will detect either positive or negative clipping (or both). Full wave rectification gives added advantages at low frequencies. Since the resistance of the LDR follows the illumination which is, in turn, derived from the extent of clipping, at low signal frequencies the attenuator will attempt to follow the signal introducing further distortion. The frequency doubling effect of the full wave rectifier however, reduces this distortion. The particular chosen LDR responds quickly (50 - 100 μsec) to "turn on" illumination but slowly to "turn off" (50 msec) conditions. This further tends to minimize the distortion introduced by operation of the inventive circuit.

Since signal levels can change rapidly, so rapidly that the eye cannot respond to the illumination of an indicator for that period, capicator C6 is provided. The capacitor C6 is normally charged to the negative supply potential through a pair of resistors. When transistor Q11 conducts, however, a portion of this charge is dissipated. When transistor Q11 ceases to conduct, the capacitor C6 will have been discharged, at least to some extent. Even after transistor Q11 is turned off, therefore, the capacitor C6 will provide a supply of current to maintain transistor Q12 conducting, and transistor Q13 turned off, increasing the period of time during which indicator 35 is energized and indicator 34 is de-energized even though the output of differential amplifier 30 may be reduced to zero. As a result, even though the clipping may occur for a short duration, the indicator is maintained energized for sufficient period so that it is visible.

Figure 3:
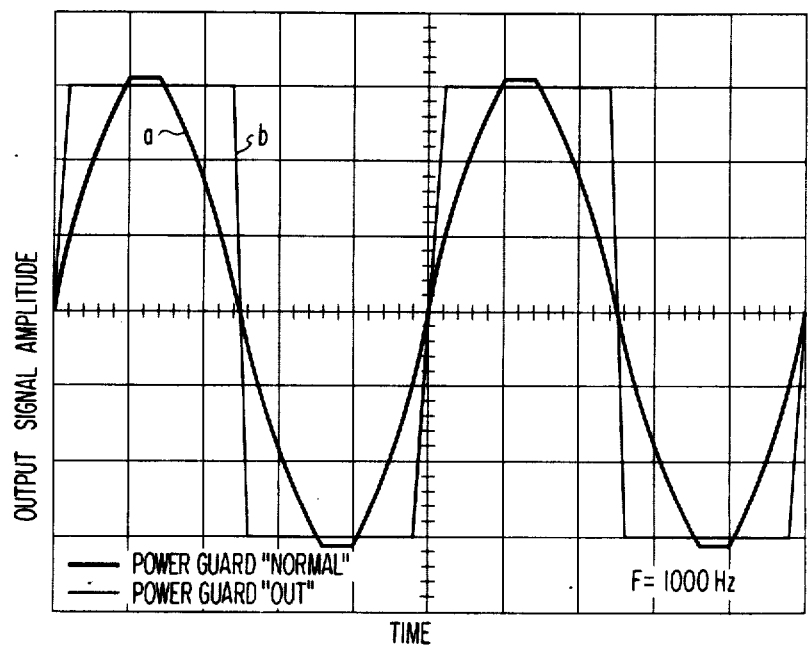

FIG. 3 illustrates two (2) curves, showing the output of amplifier 20 in the presence of an input signal having an amplitude sufficiently large to cause clipping. Wave form B shows the output of the amplifier when the switch is in the "off" condition. Under these conditions, it is apparent that the output is subject to severe clipping. Wave form A, on the other hand, illustrates the output of the amplifier, under the presence of the same input signal, when the switch is in the "on" condition. Under these circumstances, it will be seen that clipping has been minimized by operation of the inventive circuit.

In an embodiment which has been built the indicators switch at a clipping level equivalent to 0.5% total harmonic distortion while the LDR responds at a level of clipping approximating 1% total harmonic distortion.

One significant advantage of the inventive circuit is that it can be used as an "add-on" to existing equipment. Furthermore, application of the invention does not restrict the amplifier design as would the Suzuki arrangement. Finally, since internal amplifier connections are not required, a conventional IC amplifier can be employed. The only amplifier requirement is that it have a differential input configuration and employ a negative feedback system.

What is claimed is:

1. A device for maintaining linear amplification and to avoid clipping of an electrical signal applied to one input of an amplifier which amplifier includes a negative feedback coupling means coupling an amplified signal back to another input of said amplifier, said device comprising:
   a differential amplifier with a pair of inputs, one coupled to said one amplifier input and the other connected to the output of said negative feedback coupling means, said differential amplifier producing an output signal when its inputs are different;
   a full wave rectifier connected to the output of said differential amplifier; and,
   signal attenuation means coupling a source of said electrical signals to said amplifier and connected to said full wave rectifier for reducing the amplitude of the signal coupled to said amplifier when said differential amplifier produces an output.

2. The apparatus of claim 1 wherein said signal attenuation means includes resistance means connected between said source of said electrical signals and ground, said resistance means varying in resistance in accordance with the output of said differential amplifier.

3. The apparatus of claim 1 which further includes indicating means coupled to an output of said full wave rectifier.

4. The apparatus of claim 3 wherein said indicating means is energized to indicate the presence of clipping by an output from said full wave rectifier.

5. The apparatus of claim 4 wherein said indicating means includes means to maintain said indicator energized for a predetermined period after clipping has ceased.

6. The apparatus of claim 1 wherein said signal attenuation means includes a light emitting diode coupled to the output of said full wave rectifier and a light dependent resistor arranged to receive an optical signal from said light emitting diode.

7. The apparatus of claim 6 wherein said signal attenuation means is coupled between a source of said electrical signals and ground and wherein the resistance of said light dependent resistor is reduced as the optical signal from said light emitting diode increases in intensity.

8. The apparatus of claim 7 wherein said signal attenuation means includes an additional resistance coupling said source of signals to said light dependent resistor and said amplifier is coupled to the junction of said light dependent resistor and said additional resistance.

9. The apparatus of claim 8 wherein said light dependent resistor responds more quickly to "turn on" conditions than to "turn off" conditions.

10. The apparatus of claim 9 wherein the ratio of turn off to turn on time is approximately 1000 to 1.

* * * * *